(12) United States Patent
Bucholtz et al.

(10) Patent No.: US 9,654,208 B2
(45) Date of Patent: May 16, 2017

(54) SYSTEM AND METHOD FOR PHOTONIC COMPRESSIVE SAMPLING

(75) Inventors: Frank Bucholtz, Crofton, MD (US); Jonathan M. Nichols, Crofton, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 223 days.

(21) Appl. No.: 13/597,487

(22) Filed: Aug. 29, 2012

(65) Prior Publication Data
US 2013/0058657 A1    Mar. 7, 2013

Related U.S. Application Data

(60) Provisional application No. 61/529,153, filed on Aug. 30, 2011.

(51) Int. Cl.
*H04B 10/00* (2013.01)
*H03M 1/12* (2006.01)

(52) U.S. Cl.
CPC .......... *H04B 10/00* (2013.01); *H03M 1/1235* (2013.01); *H03M 1/1265* (2013.01)

(58) Field of Classification Search
CPC .............. H03M 1/1265; H03M 1/1235; H04B 10/5051; H04B 10/00
See application file for complete search history.

(56) References Cited

U.S. PATENT DOCUMENTS

| 7,283,231 | B2 | 10/2007 | Brady et al. |
| 7,427,932 | B2 | 9/2008 | Brady et al. |
| 7,432,843 | B2 | 10/2008 | Brady et al. |
| 7,463,174 | B2 | 12/2008 | Brady et al. |
| 7,616,306 | B2 | 11/2009 | Brady et al. |
| 7,928,893 | B2 | 4/2011 | Baraniuk et al. |
| 2003/0076567 | A1* | 4/2003 | Matthews et al. ............ 359/181 |

(Continued)

FOREIGN PATENT DOCUMENTS

WO    WO 2011/057679    *  5/2011

OTHER PUBLICATIONS

Optical Analog-to-Digital Conversion System Based on Compressive Sampling Hao Nan, Yuantao Gu, and Hongming Zhang, IEEE Photonics Technology Letters, vol. 23, No. 2, Jan. 15, 2011.*

(Continued)

*Primary Examiner* — Shi K Li
*Assistant Examiner* — Mina Shalaby
(74) *Attorney, Agent, or Firm* — US Naval Reseach Laboratory; Scott G. Bell

(57) ABSTRACT

A photonic compressive sampling system includes a photonic link with at least one electro-optic modulator that modulates a continuous wave optical energy with both an electrical analog signal and a pseudorandom bit sequence signal. A photodetector receives the modulated optical energy from the electro-optic modulator, and an electrical digitizer digitizes the output from the photodetector. The system enables signal recovery beyond the Nyquist limit of the digitizer. The signal being recovered has a sparse (low-dimensional) representation and the digitized samples are incoherent with this representation. An all-photonic system can faithfully recover a 1 GHz harmonic signal even when digitizing at 500 MS/s, well below the Nyquist rate.

29 Claims, 10 Drawing Sheets

(56) References Cited

U.S. PATENT DOCUMENTS

| | | | |
|---|---|---|---|
| 2004/0076440 A1* | 4/2004 | Wedding | 398/188 |
| 2011/0280588 A1* | 11/2011 | Mikkelsen et al. | 398/202 |
| 2012/0243876 A1* | 9/2012 | Tang | 398/135 |
| 2013/0163986 A1* | 6/2013 | Mamyshev et al. | 398/25 |

OTHER PUBLICATIONS

Candes et al. (Sparsity and Incoherence in Compressive Sampling, Emmanuel Candes† and Justin Romberg, Nov. 2006).*
J. Campmany and D. Novak, "Microwave photonics combines two worlds," Nat. Photonics, vol. 1, No. 6, pp. 319-330 (Jun. 2007).
J.A. Tropp, J.N. Laska, M.F. Duarte, J.K. Romberg, and R.G. Baraniuk, "Beyond Nyquist: Efficient Sampling of Sparse Bandlimited Signals," IEEE Trans. Inf. Theory, vol. 56, No. 1, pp. 520-544 (Jan. 2010).
M.F. Duarte, M.A. Davenport, D.Takhar, J.N. Laska, T. Sun, K.F. Kelly, and R.G. Baraniuk, "Single-pixel Imaging via Compressive Sampling," IEEE Signal Process. Mag., vol. 25, No. 2, pp. 83-91 (Mar. 2008).
W.L. Chan, K. Charan, D. Takhar, K.F. Kelly, R.G. Baraniuk, and D.M. Mittleman, "A single-pixel terahertz imaging system based on compressed sensing," Appl. Phys. Lett., vol. 93, pp. 121105-1-121105-3, Sep. 22, 2008.
S. Gazit, A. Szameit, Y.C. Eldar, and M. Segev, "Super-resolution and reconstruction of sparse sub-wavelength images," Opt. Express, vol. 17, No. 26, pp. 23920-23946, Dec. 16, 2009.
O. Katz, Y. Bromberg, and Y. Silberburg, "Compressive ghost imaging," Appl. Phys. Lett., vol. 95, pp. 131110-1-131110-3 (Sep. 28, 2009).
D. Yang, H. Li, G. Peterson, and A. Fathy, "Compressed Sensing Based UWB Receiver: Hardware Compressing and FPGA Reconstruction," Proceedings of the 43rd Conference on Information Sciences and Systems (CISS), p. 198-201, conference date Mar. 18-20, 2009.
M. Mishali and Y.C. Eldar, "From Theory to Practice: Sub-Nyquist Sampling of Sparse Wideband Analog Signals,"IEEE Journal of Selected Topics in Signal Processing, vol. 4, No. 2, pp. 375-391, Apr. 2010.
M. Mishali and Y. C. Eldar, "Xampling: Analog Data Compression," IEEE Computer Society, Proc. of the 2010 Data Compression Conference, pp. 366-375, conf. date Mar. 24-26, 2010.
J. Candes and T. Tao, "Decoding by Linear Programming," IEEE Trans. Inf. Theory, vol. 51, No. 12, pp. 4203-4215, (Dec. 2005).
E.J. Candes, J. Romberg, and T. Tao, "Robust uncertainty principles: exact signal reconstruction from highly incomplete frequency information," IEEE Trans. Inf. Theory, vol. 52, No. 2, pp. 489-509, (Feb. 2006).
L. Donoho, "Compressed Sensing," IEEE Trans. Inf. Theory, vol. 52, No. 4, pp. 1289-1306 (Apr. 2006).
J. Candes and M. B. Wakin, "An Introduction to Compressive Sampling," IEEE Signal Process. Mag., vol. 25, No. 2, pp. 21-30 (Mar. 2008).
J. Romberg, "Imaging Via Compressive Sampling," IEEE Signal Process. Mag. vol. 25, No. 2, pp. 14-20 (Mar. 2008).
R.G. Baraniuk, "Compressive Sensing," IEEE Signal Process. Mag., vol. 24, pp. 18-124 (Jul. 2007).
J. M. Nichols, M. Currie, F. Bucholtz, and W.A. Link, "Bayesian Estimation ofWeak Material Dispersion: Theory and Experiment," Opt. Express, vol. 18, No, 3, pp. 2076-2089 (Jan. 19, 2010).
M.A.T. Figueiredo, R.D. Nowak, and S.J. Wright, "Gradient Projection for Sparse Reconstruction: Application to Compressed Sensing and Other Inverse Problems," IEEE J. Sel. Top. Signal Process., vol. 1, No. 4, pp. 586-597 (Dec. 2007).
Nichols, J.M.; McLaughlin, C.; Bucholtz, F.;, "Characterization of a compressively sampled photonic link," Avionics, Fiber-Optics and Photonics Technology Conference (AVFOP), 2011 IEEE , pp. 33-34, Oct. 4-6, 2011.
J. Nichols, C. McLaughlin, F. Bucholtz, and J. Michalowicz, "Characterization of a compressively sampled photonic link," Appl. Opt., vol. 51, pp. 6448-6456 (Sep. 2012).
J. A. Tropp, J. N. Laska, M. F. Duarte, J. K. Romberg, and R. G. Baraniuk, "Beyond Nyquist: Efficient sampling of sparse bandlimited signals," IEEE Transactions on Information Theory, vol. 56, No. 1, pp. 520-544, Jan. 2010.
Bucholtz, F.; Urick, V.J.; Godinez, M.; Williams, K.J.; , "Graphical Approach for Evaluating Performance Limitations in Externally Modulated Analog Photonic Links," IEEE Transactions on Microwave Theory and Techniques, vol. 56, No. 1, pp. 242-247, (Jan. 2008).
Candes, E.J.; Tao, T.;, "Near-Optimal Signal Recovery From Random Projections: Universal Encoding Strategies?," IEEE Transactions on Information Theory, vol. 52, No. 12, pp. 5406-5425, Dec. 2006.
S.S. Chen , D.L. Donoho, M.A. Saunders, "Atomic decomposition by basis pursuit" , SIAM Journal on Scientific Computing, vol. 43, Issue 1, pp. 129-159, 2001.
L.I. Rudin, S. Osher, E. Fatemi, "Nonlinear total variation based noise removal algorithms", Proceedings of the eleventh annual international conference of the Center for Nonlinear Studies on Experimental mathematics: computational issues in nonlinear science; Physica D.,vol. 60, Issue 1-4, pp. 259-268, Nov. 1992.
J.A. Tropp, A.C. Gilbert, "Signal Recovery From Random Measurements Via Orthogonal Matching Pursuit", IEEE Transactions on Information Theory, vol. 53, No. 12, pp. 4655-4666, Dec. 2007.
S.Ji, Y. Xue, and L. Carin, "Bayesian compressive sensing," IEEE Trans. Signal Processing, vol. 56, No. 6, pp. 2346-2356, Jun. 2008.
H. Nan; Y. Gu; H. Zhang; , "Optical Analog-to-Digital Conversion System Based on Compressive Sampling," Photonics Technology Letters, IEEE , vol. 23, No. 2, pp. 67-69, Jan. 15, 2011.

* cited by examiner

SYSTEM AND METHOD FOR PHOTONIC COMPRESSIVE SAMPLING

CROSS-REFERENCE TO RELATED APPLICATIONS

This Application is a non-provisional under 35 USC 119(e) of, and claims the benefit of, U.S. Provisional Application 61/529,153 filed on Aug. 30, 2011, the entire disclosure of which is incorporated herein in its entirety.

BACKGROUND

1. Technical Field

This application is related to signal processing systems for compression, transmission, and reconstruction of a signal, and more particularly, to those systems suitable for use in microwave photonics applications.

2. Related Technology

High-speed digital signal processing and the development of microwave photonics systems are requiring faster and faster analog-to-digital conversion (ADC) hardware. The performance of ADC hardware continues to advance in support of these high-speed applications. For example, both wideband millimeter wave antenna systems and digital fiber optic communication links may require coverage out to 100 GHz and beyond in the future.

Digitization requirements have traditionally been based on the Shannon-Nyquist sampling theorem which states that a bandlimited signal, x(t), occupying a frequency range [0, $f_{Ny}/2$] Hz can be reconstructed at any point in time, provided that the waveform is known at a discrete set of equally spaced times no more than $\Delta = 1/f_{Ny}$ seconds apart. Thus, to capture a 100 GHz signal, the time interval $\Delta$ between samples can be at most 1/200 GHz. Digitizers operating in the 200 GS/s regime are unlikely to be available in the near future.

Compressive sampling, which is also known as "CS", "compressed sampling" or "compressed sensing", was developed to estimate the values of the signal x when sampling at a lower rate. An important application of compressed sampling is the reconstruction of discrete samples of an analog signal at or above the Nyquist rate using a digitizer operating below the Nyquist rate.

Compressive sampling can be considered to be a set of nonadaptive signal processing techniques that address the ill-conditioned problem described in E. J. Candes, J. Romberg and T. Tao, "Robust uncertainty principles: Exact signal reconstruction from highly incomplete frequency information," IEEE Trans. Info. Theory, 52(2), 489-509 (2006), E. J. Candes and T. Tao, "Near-optimal signal recovery from random projections: Universal encoding strategies?," IEEE Trans. Info. Theory, 52(12), 5406-5425 (2006), and D. L. Donoho, "Compressed Sensing," IEEE Trans. Inf. Theory 52(4), 1289-1306 (2006). Compressive sampling systems are described in R. G. Baraniuk, "Compressive Sensing," IEEE Sig. Proc. Magazine, July 2007, 118-124 (2007).

J. A. Tropp, J. N. Laska, M. F. Duarte, J. K. Romberg and R. G. Baraniuk, "Beyond Nyquist: Efficient sampling of sparse bandlimited signals," IEEE Trans. Info. Theory, 56(1), 520-544 (2010) provides an overview of compressive sampling techniques.

BRIEF SUMMARY

A photonic compressive sampling system comprises a photonic link unit arranged to receive an electrical analog signal, the photonic link unit having at least one electro-optic modulator configured to modulate a continuous wave optical energy with both the electrical analog signal and with a pseudorandom bit sequence signal, and having a photodetector arranged to receive the modulated optical energy from the electro-optic modulator. The system has an electrical digitizer arranged to receive an output from the photodetector, the electrical digitizer having a sampling rate less than the Nyquist rate of the electrical analog signal. The system can also include a pseudorandom bit sequence generator configured to transmit the pseudorandom bit sequence signal to the electro-optic modulator and to transmit a pseudorandom bit sequence signal trigger to the electrical digitizer. The system can also include a laser in optical communication with the electro-optic modulator, configured to generate the continuous wave optical energy. The system can also include an amplifier to amplify the electrical output of the photodetector, and a low pass filter or an integrator receive the electrical output of the photodetector.

The at least one electro-optic modulator can include a first Mach Zehnder modulator and a second Mach Zehnder modulator arranged in series, the first Mach Zehnder modulator arranged to amplitude modulate the optical beam with the electrical analog signal, the second Mach Zehnder modulator arranged to amplitude modulate the optical beam with the pseudorandom bit sequence signal voltage. The photodetector can be a balanced photodetector, with the first output and a second output of the second Mach Zehnder modulator being simultaneously input to the balanced photodetector.

In one example of the photonic compressive system, a combiner is configured to combine the electrical analog signal and a pseudorandom bit sequence signal. The at least one electro-optic for modulating the optical energy with the combined electrical analog signal and the pseudorandom bit sequence signal from the combiner. The photodetector can be a balanced photodetector, with a first output and a second output of the Mach Zehnder modulator being simultaneously input to the balanced photodiode.

In another example, the at least one electro-optic modulator includes a first phase modulator and a second phase modulator arranged in series, with the first phase modulator configured to modulate the continuous wave optical energy with the electrical analog signal, and the second phase modulator configured to receive the phase modulated optical energy and to modulate the phase modulated optical energy with the pseudorandom bit sequence signal. A path imbalanced Mach Zehnder interferometer biased at null receives the receive the optical output of the second phase modulator and transmits the optical output of the path imbalanced Mach Zehnder interferometer to the photodetector.

In another example, the least one electro-optic modulator includes a first phase modulator and a second phase modulator arranged in series, with the first phase modulator arranged to modulate the continuous wave optical energy with the pseudorandom bit sequence signal, and the second phase modulator configured to receive the modulated optical energy and to modulate the modulated optical energy with the electrical analog signal. A path imbalanced Mach Zehnder interferometer biased at null receives the optical output of the second phase modulator and transmits the optical output of the path imbalanced Mach Zehnder interferometer to the photodetector.

In another example, the at least one electro-optic modulator includes a first phase modulator and a second phase modulator arranged in series, and the photodetector is a balanced photodetector. The first phase modulator is arranged to modulate the continuous wave optical energy with the electrical analog signal, the second phase modulator is configured to receive the phase modulated optical energy and to modulate the phase modulated optical energy with the pseudorandom bit sequence signal. A path imbalanced Mach Zehnder interferometer biased at null receives the optical output of the second phase modulator and transmits two optical outputs of the path imbalanced Mach Zehnder interferometer simultaneously to the balanced photodetector.

In another example, the at least one electro-optic modulator comprises a first phase modulator and a second phase modulator arranged in series, and photodetector is a balanced photodetector. The first phase modulator is configured to modulate the continuous wave optical energy with the pseudorandom bit sequence signal, and the second phase modulator is configured to receive the phase modulated optical energy from the first phase modulator and to modulate the phase modulated optical energy with the electrical analog signal. A path imbalanced Mach Zehnder interferometer biased at null receives the optical output of the second phase modulator and to transmit two optical outputs of the path imbalanced Mach Zehnder interferometer simultaneously to the balanced photodetector.

In another example, a combiner combines the electrical analog signal and a pseudorandom bit sequence signal. The least one electro-optic modulator includes a single phase modulator and a path-imbalanced Mach Zehnder interferometer biased at null arranged in series, with the phase modulator arranged to modulate the continuous wave optical energy with the combined electrical analog signal and pseudorandom bit sequence signal, and the path-imbalanced Mach Zehnder interferometer receiving the optical output of the phase modulator and transmitting the optical output of the Mach Zehnder interferometer to the photodetector.

In another example, a combiner combines the electrical analog signal and a pseudorandom bit sequence signal, and the photodetector is a balanced photodetector. The at least one electro-optic modulator includes a single phase modulator and a path-imbalanced Mach Zehnder interferometer arranged in series. The phase modulator modulates the continuous wave optical energy with the combined electrical analog signal and pseudorandom bit sequence signal. The path-imbalanced Mach Zehnder interferometer is biased at null and receives the optical output of the phase modulator and transmit the two optical outputs of the Mach Zehnder interferometer simultaneously to the balanced photodetector.

Each example enables signal recovery beyond the Nyquist limit of the digitizer, when the signal being recovered has a sparse (low-dimensional) representation and the digitized samples are incoherent with this representation.

DETAILED DESCRIPTION OF EMBODIMENTS OF THE INVENTION

A brief discussion of a theory of compressive sampling, or compressive sensing is provided for information.

Figure 1:
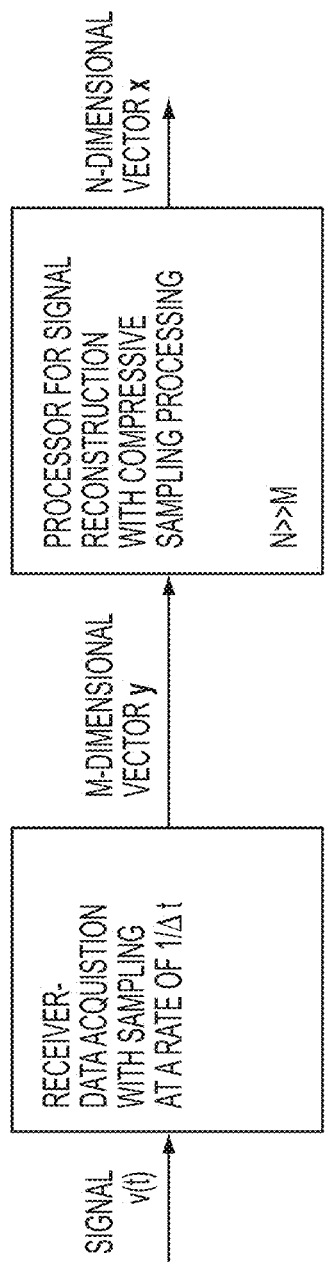
FIG. 1 is a general illustration of a compressive sampling system.

FIG. 1 illustrates the basic architecture of a compressive sampler. Continuous, time varying signal v(t) enters the data acquisition unit 10 yielding vector y. Here, $y^T$ is an M-dimensional vector $\{y(1)\ y(2)\ \ldots\ y(M)\}$ representing the signal at discrete times mΔt, with m increasing from 1 to M (with the increment counter m being 1≤m≤M). The data acquisition system's digitizer has a sampling rate of 1/Δt, so the smallest increment of time between samples is Δt. A goal is to obtain samples of the input signal v(t) at times more frequent than allowed by the digitizer's sampling rate. For example, it is desired to obtain samples of the input signal v(t) at times nΔτ (with the increment counter n being 1≤n≤N) with Δτ=(M/N) Δt ≪ Δt and N>M. It is desired to obtain data $x^T=\{x(1)\ x(2)\ \ldots\ x(N)\}$ comprising the input voltage v(t) sampled at a fast rate 1/Δτ, but the digitizer is limited to a slower rate 1/Δt.

Under the proper conditions, a compressive sampling system 20 allows the unknown N-dimensional vector x to be obtained from the measured M-dimensional vector y, even when M ≪ N and therefore, when Δτ is less than Δt. Practically, this means it is possible to obtain a Nyquist-rate-sampled version of a signal using a digitizer operating well below the Nyquist rate. The price paid for this advantage is a constraint on the desired signal vector x. The constraint is known as sparcity, and is discussed further below.

To aid in understanding the CS process, assume a digitizer operating at the fast sampling rate 1/Δτ in the front end of a data acquisition system 10. A fast-sampled signal x is processed by the data acquisition unit 10, yielding vector y. Assume that the acquisition system is a linear system so that y and x are related by an M×N matrix A such that $$y=Ax. \quad (1)$$

If y and x are of exactly the same dimension, and if A is nonsingular, the solution $x=A^{-1}y$ can be easily obtained. However, in the situation in which the dimensionality of y is smaller, and potentially much smaller, than x, the problem is ill-conditioned and cannot be solved by traditional methods. A solution obtained by compressed sensing cannot be guaranteed but can be shown to be unique with overwhelming probability, according to E. J. Candes and T. Tao, "Decoding by linear programming," IEEE Trans. Info. Theory, 51 (12) pp. 4203-4215 (2005).

An N-dimensional vector x can be represented in terms of an arbitrarily-chosen set of orthonormal basis vectors $$x=\Psi\theta \quad (2)$$

in which the set of N orthonormal basis vectors $\{\psi_i\}_{i=1}^{N}$ comprise the columns of the N×N matrix $\Psi$ and in which the N×1 column vector of coefficients, $\theta$, are the projections of x onto the basis vectors $\{\psi_i\}_{i=1}^{N}$. If, for example, $\Psi$ is the cosine basis, then Equation (2) represents the discrete cosine transformation (DCT) used in the non-adaptive JPEG compression approach. The magnitude of each element in the column vector of coefficients $\theta$ is a measure of the relative strength of the corresponding basis vector in representing the signal. For a compression technique to be effective it must be true that, for signals x of interest, most of the signal energy is contained in only a few, say, $K \ll N$ of the elements of $\theta$. In this case, the representation of x is said to be sparse with respect to the basis $\Psi$. In general, there may be only a few sets of basis vectors for which a signal, or family of signals, has a sparse representation. The onus is on the user to employ the correct set of basis vectors to obtain sparse signal representations. Thus, any a priori information about the signals to be received is invaluable in choosing a sparse representation basis.

Given x, the coefficient vector $\theta$ can be obtained from the inner products (projections) $\theta_i=\langle\psi_i,x\rangle$. However, in compressive sensing the whole point is that x is not known a priori. In order to obtain x, compressive sampling methods can use the following strategy:

1) Assume an N-dimensional (and unknown) vector x is input to the acquisition system;
2) using the system model, calculate the expected vector y resulting from input vector x;
3) compare the predicted to the observed vector y;
4) reconstruct the most likely x that is consistent with the observed y and that has the sparsest representation in $\Psi$, that is, that has the fewest nonzero components in $\theta$.

The basic steps of a compressive sampling process are as follows. The compressive sampling system will allow reconstruction of x, given the observed vector y, knowledge of the matrix $\Psi$, and knowledge of the data acquisition system.

(i) Initially, choose a set of orthonormal basis vectors $\Psi$ such that the representation of the signal x has sparseness K in that basis. Then, equation (1) can be rewritten as the system model $$y=A\Psi\theta \quad (3).$$

(ii) An M×N matrix A, called the measurement matrix, depends on the details of the data acquisition system. The measurement matrix A should be chosen so that, upon reduction of the dimensionality from N to M, information needed for subsequent reconstruction of the signal is not lost. See R. G. Baraniuk, "Compressive Sensing," IEEE Sig. Proc. Magazine, July 2007, 118-124 (2007) for additional information related to the measurement matrix.

(iii) Condition (ii) is easily satisfied provided the product matrix $\Phi=A\Psi$ satisfies the so-called restricted isometry property (RIP) described in E. J. Candes and T. Tao, "Near-optimal signal recovery from random projections: Universal encoding strategies?," IEEE Trans. Info. Theory, 52(12), 5406-5425 (2006), incorporated by reference herein in its entirety. This restricted isometry property requires that there exists a value $\epsilon_k>0$, and having a value not too close to one, such that $$(1-\varepsilon_k) \le \frac{\|y\|_2^2}{\|\theta\|_2^2} \le (1+\varepsilon_k) \quad (4)$$

holds for every K-sparse vector $\theta$. Here, the L-2 norm of vector u is denoted $\|u\|_2$, which is equal to $$\|u\|_2 = \left(\sum_{i=1}^{N} |u_i|^2\right)^{1/2}. \quad (5)$$

Note that equation (4) for the restricted isometry property is satisfied identically for $\epsilon=0$ when the product matrix $\Phi$ is the identity matrix. The product matrix $\Phi$ approaches the identify matrix as the matrices A and $\Psi$ become incoherent where, here, incoherence means that none of the rows of A has a sparse representation in $\Psi$. A random matrix can be used for A, since a random matrix has low coherence with many orthonormal bases, e.g., delta spike, cosine, wavelet.

Once these conditions are met, a reconstruction algorithm can be designed and implemented to obtain the N-dimensional coefficient vector $\theta$ from the M-dimensional data vector y (with N>M).

(iv) Reconstruction of x given y can be accomplished by means of constrained minimization of the L1-norm of $\theta$, as described in E. J. Candes and T. Tao, "Near-optimal signal recovery from random projections: Universal encoding strategies?," IEEE Trans. Info. Theory, 52(12), 5406-5425 (2006) and R. G. Baraniuk, "Compressive Sensing," IEEE Sig. Proc. Magazine, July 2007, 118-124 (2007) according to $$\hat{\theta}=\mathrm{argmin}\|\theta\|_1 \text{ subject to } y=A\Psi\theta \quad (6)$$

where the term $\|\theta\|_1$ is the sum of the coefficients:

$$\|\theta\|_1 = \sum_{i=1}^{N} \theta_i. \quad (7)$$

In other words, the optimal estimation of $\theta$ is one that minimizes the L1-norm of $\theta$, subject to a constraint that the observed data y matches the system model in a least-squared sense.

Here, we can modify the minimization requirement as $$\hat{\theta}=\mathrm{argmin}\{\|y-A\Psi\theta\|_2^2+\gamma\|\theta\|_1\}, \quad (8)$$

in which it is specified that the observed values match the model predictions in a least-squared sense and the L1-norm of $\theta$ is minimized with scale factor scale factor $\gamma$, where $\gamma$ is a sparcity-promoting factor.

The optimization problem of equation can be solved by various methods, including a gradient projection method of Figueiredo, or those of Osher, Chen, Tropp, or Ji.

The foregoing brief discussion of compressive sampling theory is provided for information, and is not intended to limit the scope of the appended claims, or to otherwise limit the systems and methods described in the following paragraphs.

Figure 2:
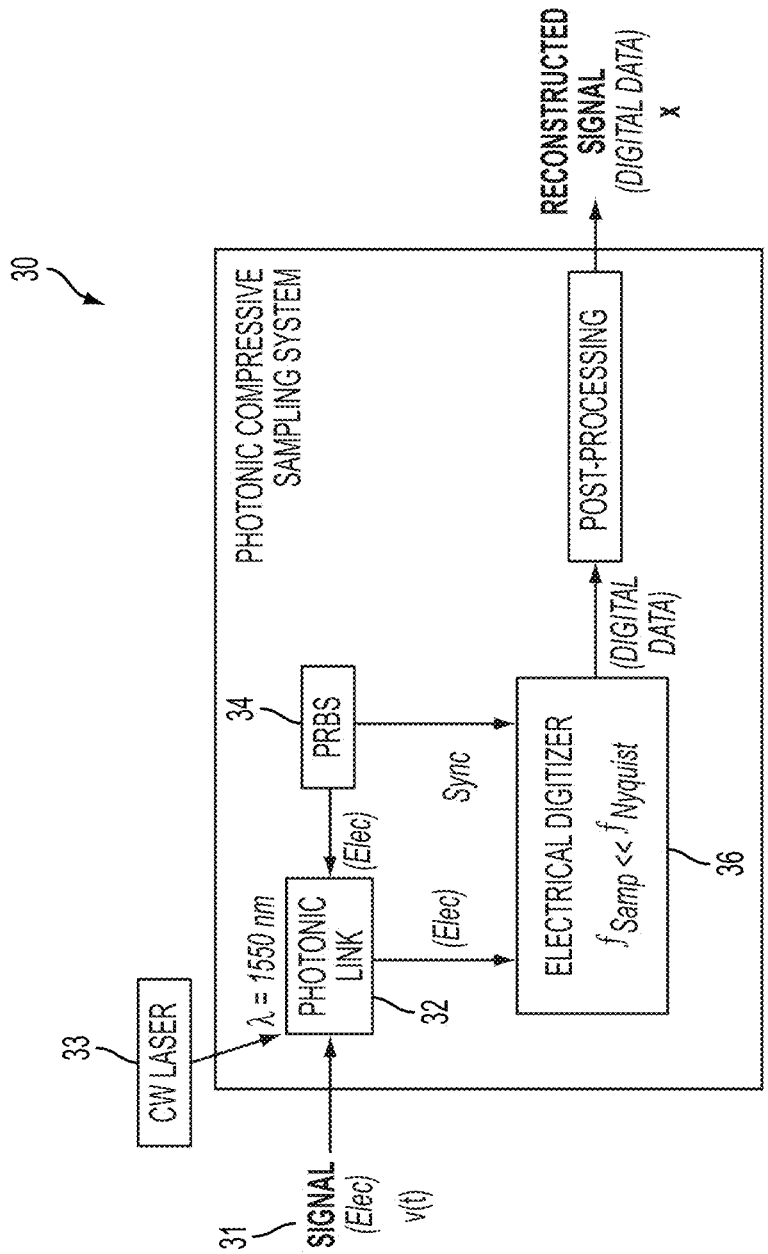
FIG. 2 illustrates the data acquisition portion of a photonic compressive sampling system.

FIG. 2 illustrates the basic architecture of a photonic compressive sampling system in accordance with an embodiment of the invention.

An analog electrical input signal v(t) 31 enters the data acquisition system 30, and specifically enters the photonic link 32.

In the photonic link, an electro-optic modulator uses the electrical signal v(t) 31 and a pseudorandom bit sequence generated by a pseudorandom bit sequence pattern generator 34 to amplitude modulate continuous wave coherent optical energy, e.g., from a CW laser. A photodiode in the photonic link 35 converts the modulated optical energy to an electrical signal, which is transmitted to an electrical digitizer 36. The electrical digitizer 36 has a sampling rate that is less than the Nyquist rate required to reproduce the analog electrical signal v(t). The output of a photodiode in the photonic link 32 is electrically digitized at an effective rate below the Nyquist rate for the incoming signal.

Figure 3:
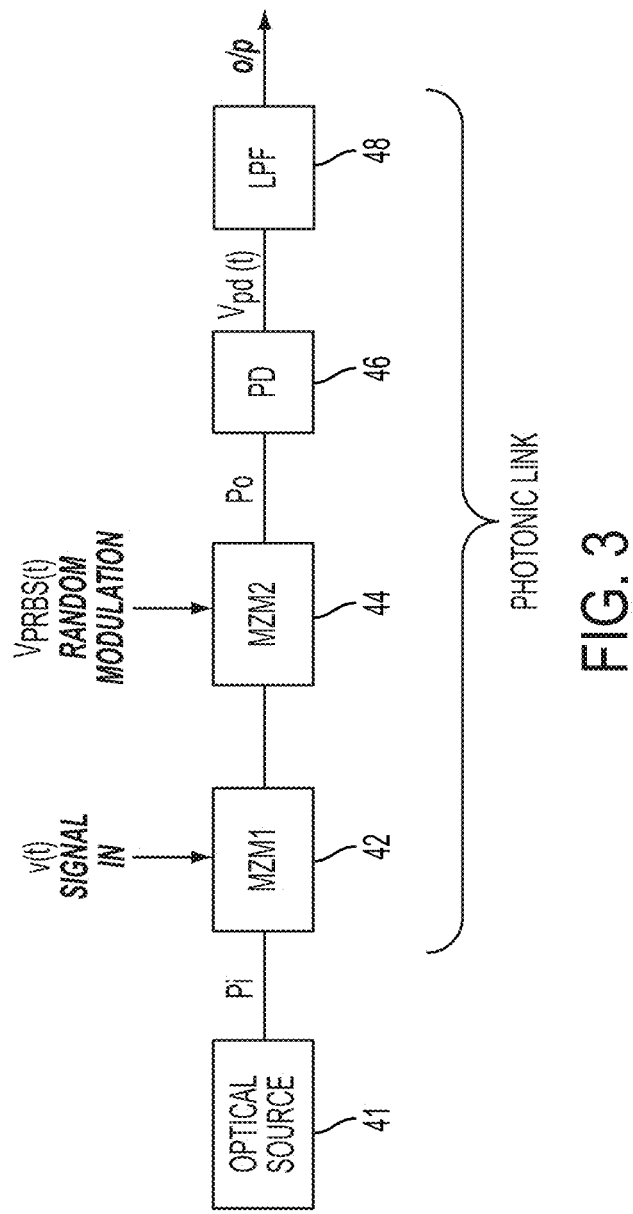
FIG. 3 illustrates an embodiment of a photonic compressive sampling system.

FIG. 3 illustrates an example of a photonic link 32 in more detail.

The link includes two in-series electro-optic modulators 42 and 44 suitable for modulating cw optical energy with an electrical signal. In this example, the electro-optic modulators are Mach-Zehnder modulators (MZM's) with one or more electrodes for receiving electrical signals and one or more output ports for outputting optical energy. Details of MZM operation is described in F. Bucholtz, V. J. Urick, M. Godinez and K. J. Williams, "Graphical approach for evaluating the performance limitations in externally-modulated analog photonic links," IEEE Trans, Microwave Theory Techniques, 56(1) 242-247 (2008), incorporated herein by reference in its entirety. The optical source can be a continuous wave laser operating at a wavelength such as, for example, 1550 nm.

The output optical power from an ideal MZM, with an input optical power Pi and an input voltage V, will be $$P_o = (P_i + 2)(1 + \cos \phi) \quad (9)$$

where $\phi = \pi V/V_\pi$ and $V_\pi$ is the modulator's half wave voltage. Here the input voltage V includes both the signal voltage v(t) and a static bias voltage $V_b$, with $V=V_b+v(t)$. The interferometric phase $\phi$ similarly includes both a static bias phase and a signal phase. At or near the quadrature point (when the bias voltage $V_b=V_\pi/2$), the output power $P_o$ will be approximately linear with respect to the input signal voltage for small phase shifts, $$P_o \xrightarrow[v_b=v_\pi/2]{} (P_i/2)(1-\sin(\pi v(t)/V_\pi)). \quad (10)$$

In setting the bias voltage to quadrature, it is not necessary that the bias voltage be set precisely to $V_\pi/2$. The bias voltage needs to be close enough to quadrature to satisfy the linearity requirements of the system.

It is preferred that the photodiode output voltage $V_{PD}$ be approximately linear for levels of optical power generated by the electro-optic modulators, with $V_{PD}=\eta P_o$, so nonlinear terms in the photodiode response can be neglected in this analysis.

Any real photonic link of the type shown in FIG. 3 has two non-ideal electro-optical modulators in series. With both modulators biased at quadrature, the photodiode output voltage $V_{PD}(t)$ can be modeled in terms of the input signal voltage v(t) and the pseudorandom bit sequence voltage $V_{PRBS}(t)$ as $$V_{PD}(t)=(a+b\sin(\alpha v(t)))(c+d\sin(\beta V_{PRBS}(t))), \quad (11)$$

where a, b, c, d, $\alpha$, and $\beta$ are experimental constants with $\alpha=\pi/V_{\pi 1}$ and $\beta=\pi/V_{\pi 2}$, with $V_{\pi 1}$ and $V_{\pi 2}$ being the half-wave voltages for $MZM_1$ (signal) and $MZM_2$ (PRBS), respectively. Non-ideality of the modulators is taken into account by allowing the ratios b/a and d/c to differ from unity. In practice, the photodiode is capacitively coupled, and thus, the static term ac in the equation above is expected to be absent at the output. In addition, the signal voltage can be assumed to be small enough so the term $\alpha v(t)$ will be much less than one, so the term $\sin(\alpha v(t))$ can be approximated to be equal to $\alpha v(t)$. The equation above for $V_{PD}$ can be rewritten as $$V_{PD}(t)=(B+C\sin(\beta V_{PRBS}(t)))(v(t)+A\sin(\beta V_{PRBS}(t))). \quad (12)$$

The constants A, V, C, $\alpha$, and $\beta$ are all obtained by experimental calibration. The relationship between these constants is A=ad, B=$\alpha$bc, and C=$\alpha$bd.

The low pass filter 48 filters the output of the photodiode 46, and acts to effectively integrate, or sample and hold, the output signal.

Note that FIG. 3 shows that the signal voltage v(t) modulates the optical energy from the optical source at MZM1, after which the random modulation $V_{PRBS}(t)$ modulates the optical output of MZM1. It is also suitable to modulate the optical energy from the optical source with the random modulation voltage $V_{PRBS}(t)$ first, and then modulate the resulting optical energy with the signal voltage v(t).

Figure 4:
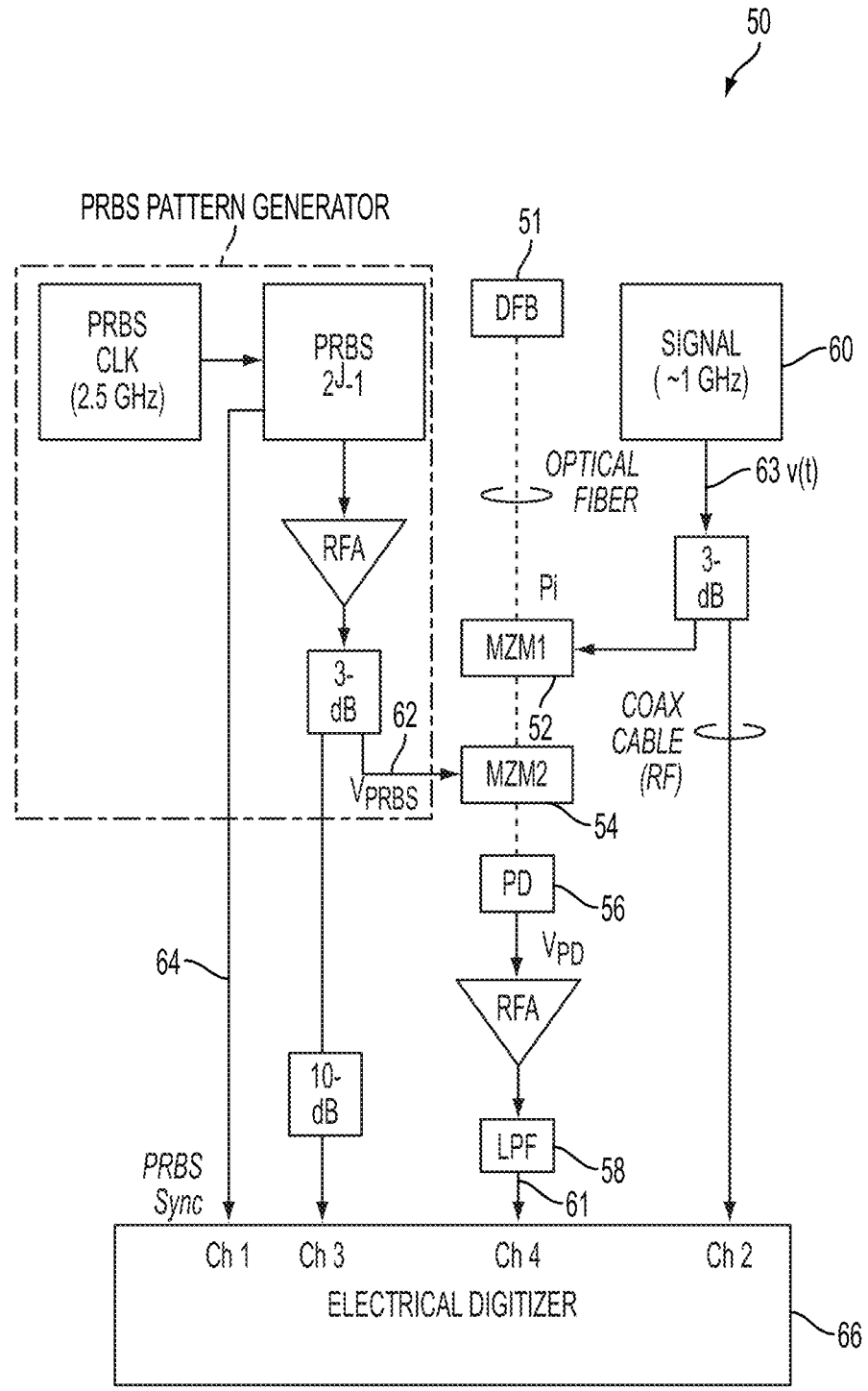
FIG. 4 illustrates an embodiment of a photonic compressive sampling system in more detail.

FIG. 4 illustrates an embodiment of a photonic compressive sampling system 50 in an experimental set-up. In this example, it is desired to recover sinusoidal signals near 1 GHz using a PRBS with an underlying clock running at 2.5 GHz and with the digitizer 66 operating at less than 2 gigasamples per second (<2 GS/s), which is less than the Nyquist rate.

In this example, the laser source for the MZM is a distributed feedback laser 51 operating near 1550 nm. The photodiode 56 is capacitively coupled, has an internal 50-ohm resistor, and has a 3-dB electrical bandwidth of approximately 18 GHz, a value more than needed to recover signals of interest without distortion or attenuation.

Note that FIG. 4 shows that the signal voltage v(t) modulates the optical energy from the optical source at MZM1, after which the random modulation $V_{PRBS}(t)$ modulates the optical output of MZM1. It is also suitable to modulate the optical energy from the optical source with the random modulation voltage $V_{PRBS}(t)$ first, and then modulate the resulting optical energy with the signal voltage v(t).

To demonstrate the photonic CS concept experimentally, the following signals were digitized: the LPF output 61, the PRBS voltage 62, the signal voltage 63, and a synchronization signal 64 corresponding to the start of the PRBS and used to trigger the digitizer 66. These stored signals can be useful for troubleshooting the hardware and for verifying the signal model. The four-channel digitizer 66 was operated at 10 GS/s for all measurements, and sub-Nyquist decimation of the data was done in post-processing.

Figure 5A:
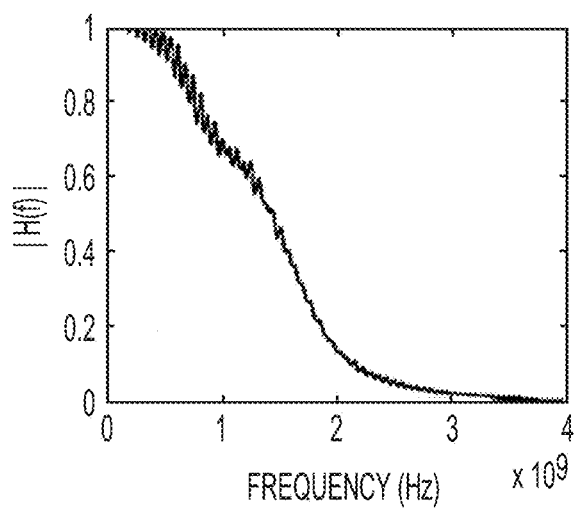
FIG. 5A is a plot of the magnitude of the frequency response H(f) versus the frequency f for the FIG. 4 system.
Figure 5B:
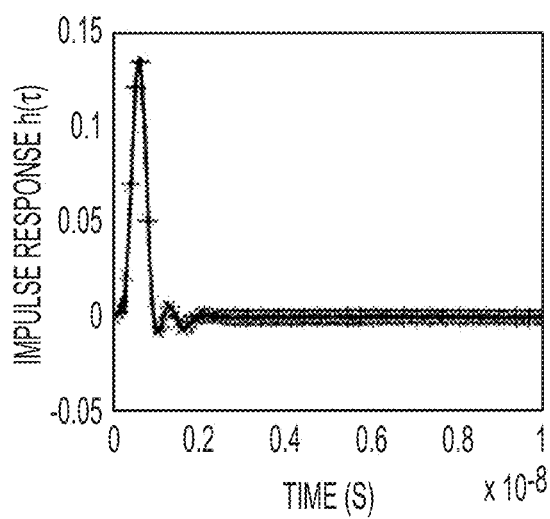
FIG. 5B is a plot of the calculated time-domain response h(τ) versus time for the FIG. 4 system.

In order to reconstruct the input signal the low-pass filter 58 is carefully characterized, by measuring the standard RF quantity S21 using a network analyzer to obtain the complex frequency response H(f) of the filter. For CS reconstruction, it is more natural to make calculations in the time-domain so the (real) time domain response h(t) is obtained using a discrete inverse Fourier transform. The results for the particular filter used in this demonstration (Mini-Circuits SBLP-933) are shown in FIGS. 5A and 5B. FIG. 5A is a plot of the magnitude of the frequency response H(f) versus the frequency f for the FIG. 4 system. FIG. 5B is a plot of the calculated time-domain response h(τ) versus time the FIG. 4 system.

The PRBS was generated by a Pulse Pattern Generator (Anritsu MP1763B). For the data presented here, a $2^{10}-1$ sequence length was used. An Analog Signal Generator (Agilent E8257B) provided the clock for the Pattern Generator. The signal itself was produced by a Vector Signal Generator (Agilent E8267C). A distributed-feedback (DFB) laser (EM4 EM253-080-0049) provided light to single-mode optical fiber and two Mach-Zehnder modulators (MZM). The first MZM (JDS Uniphase 21041423) used the signal voltage to modulate the light intensity while the second MZM (JDS Uniphase OC 192 10024180) modulated the light a second time, this time with the PRBS voltage. In both cases, the MZMs were held at optical quadrature manually. Modulated light was then detected using a photodetector (Discovery Semiconductor DSC #141554-30S).

In the discussions above of the transfer function of this "analog link", it was shown that the output voltage contains a term proportional to the product of the signal voltage and the PRBS voltage. It is this mixing term that is necessary for CS digitization. With both modulators operating at quadrature, the PRBS modulator acted as an "on-off" modulator. A filter (Mini-Circuits SBLP-933) was used to perform the "integration" or "sample-and-hold" function.

Two RF amplifiers were also employed. The first device (Picosecond Pulse Lab 5865 Driver) amplified the PRBS voltage to levels sufficient to drive the second modulator to "on" and "off" states. The second amplifier (Picosecond Pulse Lab 5840 Amplifier) raised the output voltage levels sufficiently so that noise internal to the 4-Channel Digitizer (LeCroyWaveMaster 8500A) was negligible compared to signal voltages. Note also that the LeCroy digitizer recorded replicas of both the PRBS voltage and the signal voltage (Channels 2 & 3 in FIG. 4). As discussed above, although not required for signal reconstruction, having access to these voltages (a) was used in determining certain coefficients in the system model, (b) greatly aided troubleshooting when the system was first brought online and (c) was useful for testing the fidelity of the signal model.

The temporal spacing in the time-domain response, ΔT, is fixed by the frequency spacing Δf and the total number of points G in the network analyzer measurement, according to ΔT=1/GΔf. However, for use in CS reconstruction, an N-dimensional vector is constructed, which corresponds to the time-domain response that is sampled at the same rate as the input signal. In this demonstration, this construction was accomplished by interpolation and re-sampling, leading to the result shown in FIG. 5B, an N-dimensional vector h.

Recall that the first step in a compressive sampling system is to assume that the input signal v(t) has been digitized at a fast rate, leading to an N-dimensional signal vector x. This fast-digitized version of the input signal will be reconstructed using the photonic compressive sampling system.

Assume further that $V_{PRBS}(t)$ has been digitized at the same rate to form the N-dimensional vector m. Let z denote the output of the photodiode, corresponding to the signal vector x. Let R=diag (B+C sin(βm)) be the diagonal N×N matrix formed by the elements of the vector B+C sin(βm). Then, from equation (12) for $V_{PD}(t)$, the vector z is equal to $$z=Rx+A \sin(\beta m) \quad (13)$$

The effect of the low pass filter on the photodiode output can be written compactly as $$u=Hz \quad (14)$$

where u is the N-dimensional filter output vector and the filter matrix H is given by $$H = \begin{bmatrix} h(1) & 0 & 0 & 0 & 0 & \ldots & 0 \\ h(2) & h(1) & 0 & 0 & 0 & \ldots & 0 \\ \ldots & & & & & & \ldots \\ h(W) & h(W-1) & \ldots & h(1) & 0 & \ldots & 0 \\ 0 & h(W) & \ldots & & & & \\ 0 & 0 & h(W) & h(W-1) & h(W-2) & \ldots & 0 \\ 0 & \ldots & 0 & h(W) & h(W-1) & \ldots & h(1) \end{bmatrix}. \quad (15)$$

Note that the choice of integer W depends on the characteristics of the filter and the random modulation. The N-dimensional vector u is recorded by the vector. However, to demonstrate compressive sampling reconstruction of the signal vector, the M-dimensional vector y is needed, with y being a vector that is related to x by a linear model of the form of equation (1) sampled over the same time interval as x but at a slower rate $1/\Delta t=(M/N)(1/\Delta\tau)$. To extract the vector y, first subtract from u the part of the photodiode output that is due only to the PRBS voltage, then downsample the result. Down-sampling is accounted for using the M×N matrix D with entries $$D_{ij}=\delta(i-jM/N) \quad (16)$$

wherein δ is the Kroniker delta.

Finally, the vector y is $$y=DH(z-A \sin(\beta m))=DHR\Psi\theta \quad (17).$$

Reconstruction of x is achieved by obtaining the estimate for $\hat{\theta}$ through solution of the optimization problem $$\hat{\theta}=\operatorname{argmin}\{\|y-DHR\Psi\theta\|_2^2+\gamma\|\theta\|_1\} \quad (18).$$

Example and Experimental Results

This example demonstrates compressive reconstruction using a photonic compressive sampling system. The original 1 GHz sinusoidal tone is sampled at a time interval Δτ equal to 0.1 nanoseconds using a digitizer operating at 833 MSamples/sec—a rate 2.4 times below the Nyquist rate of 2 GSamples/sec. All three samples are digitized, including the PRBS voltage VPRBS(t), input sinusoidal voltage v(t), and system output voltage $V_{PD}(t)$, at 10 GSamples/sec. The stored $V_{PD}(t)$ data was then downsampled at a rate of 1:12 in order to obtain the equivalent of the system output voltage sampled at 833 MSamples/sec, a vector with M=83 that is the vector y in equations (1), (3), (4), (8), and (17). For this example, the length of the pseudorandom bit sequence was $2^{10}-1=1023$, of which 1022 points were used.

Figure 6:
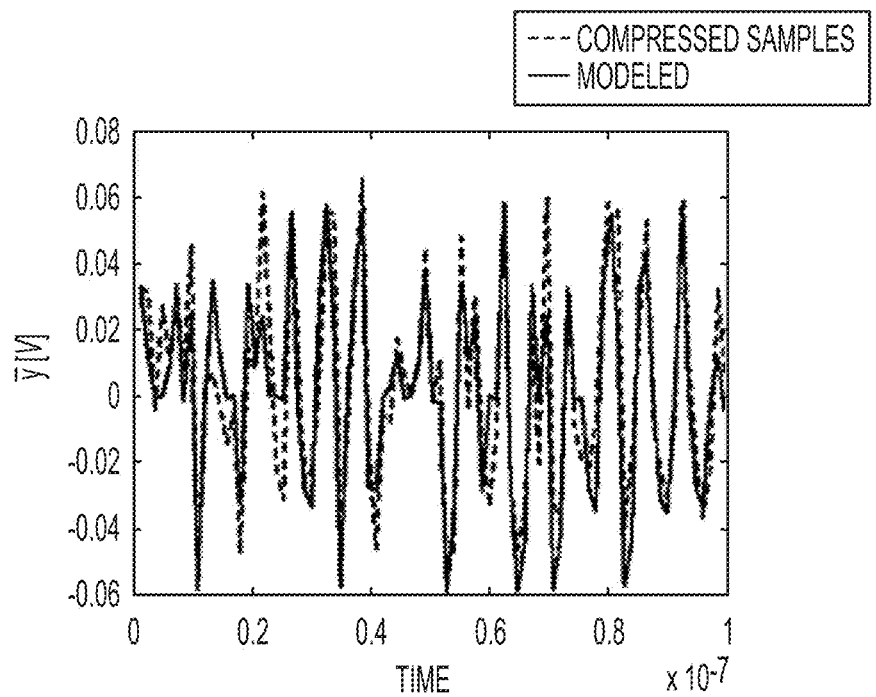
FIG. 6 is a plot comparing the predicted system output based on the system model with the observed data.

FIG. 6 shows a comparison of the modeled values for the system output voltage (using $V_{PRBS}(t)$, v(t), and Equation (14)) with the actual system output $V_{PD}(t)$ measured at the output of the photodiode.

The agreement between the model prediction and the actual compressed sampling measured output voltage is reasonably good, although disparities appear. The disparities may be due to inaccuracies in both the system model and the characterization of the low pass filter. Even with these disparities, signal reconstruction appears to be quite good.

Figure 7:
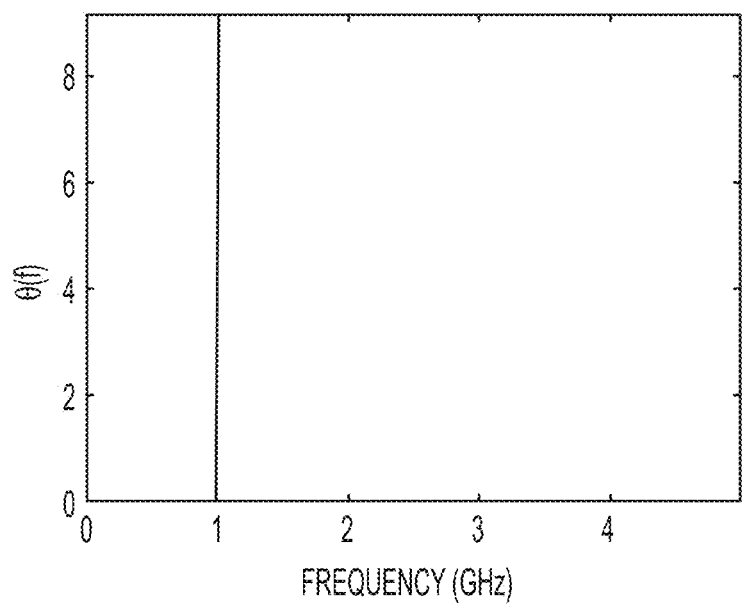
FIG. 7 shows the reconstructed cosine basis coefficients θ versus frequency.

FIG. 7 shows the reconstructed cosine basis coefficients θ versus frequency. The vector of reconstructed cosine basis coefficients θ are obtained using the gradient projection method of Figuerido applied to Equation (8). Since the components of θ are projections of the reconstructed signal onto the cosine bases, FIG. 7 effectively shows the discrete Fourier frequency spectrum of the recovered signal, which has a single component near 1 GHz, as expected. When performing reconstructions on similar input signals, erroneous energy is sometimes observed at lower frequencies, which is believed to be due to the inaccuracies in the system model and the characterization of the low pass filter.

The reconstruction in this example uses a discrete cosine basis Ψ with elements $$\Psi_{nk} = \sqrt{2/N} \begin{cases} 1/\sqrt{2} & k = 1 \\ \cos(\pi(2n-1)(k-1)/2N) & k \neq 1 \end{cases}$$

Equivalently, the cosine basis can be written as $$\Psi_{nk} = \sqrt{2/N} \begin{cases} 1/\sqrt{2} & k = 1 \\ \cos(2\pi f_k n - \varphi_k) & k \neq 1 \end{cases} \quad (19)$$

where $f_k=(k-1)/2N$ and $\varphi_k=\pi(k-1)/2N$ are the frequency and phase, respectively, of the cosinusoidal basis vector occupying the k-th column of Ψ. Each increment of integer n corresponds to one time step in the high-rate reconstructed signal. Since the data is to be reconstructed at 10 Gsample/sec, each time step is 0.1 nanoseconds and N=1002 so that, for this reconstruction, the coefficient θ(k) gives the strength of the reconstructed signal at frequency $f_k=(k-1)(4.99$ MHz).

The value of k corresponding to the frequency $f_k$ is found as $k=(f_k/4.99$ MHz$)-1$. Thus, a signal at 1 GHz corresponds to a k value of approximately 200.

Note that the 1 GHz test signal does not align precisely with any of the frequencies on the reconstruction basis. In this case, the reconstruction process assigns all the energy to the k=201 column corresponding to 0.998 GHz, in much the same way that a spectrum analyzer would assign a discrete frequency component to a range of frequencies within one frequency bin.

Figure 8:
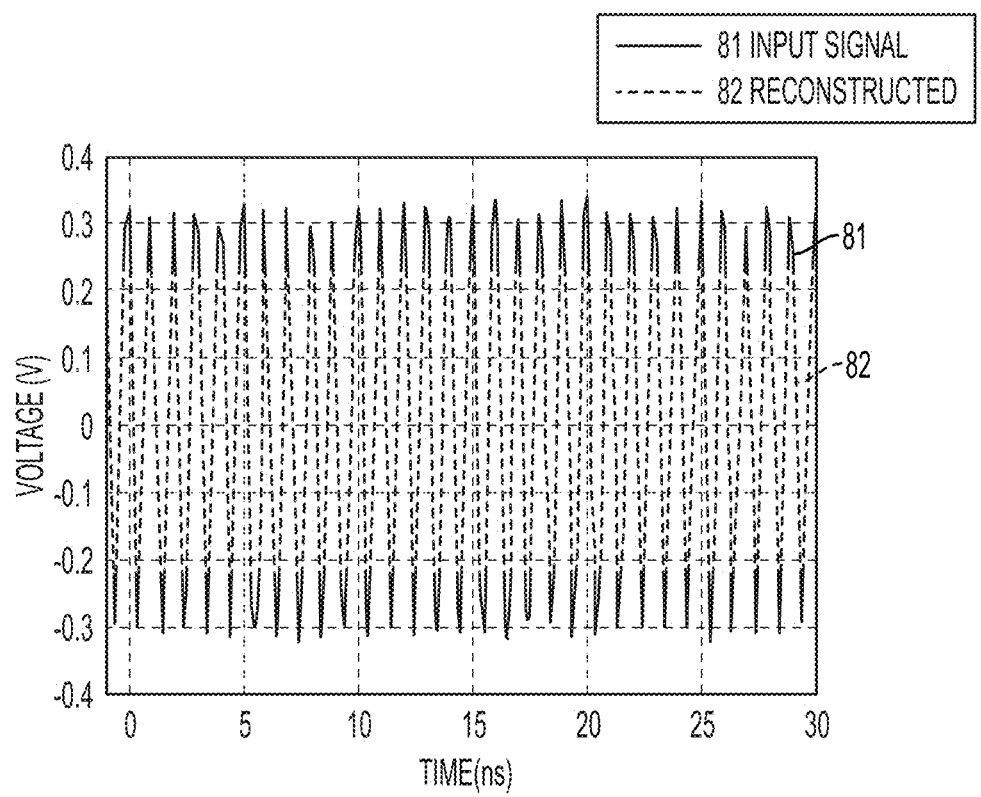
FIG. 8 is a comparison of the original input signal and the constructed signal x.

FIG. 8 is a comparison in the time domain of the original one GHz input signal 81 and the reconstructed signal x obtained using the θ vector and equation (2). In this example, the reconstructed signal 82 is a nearly perfect replica of the input signal over this time interval, except for a small scale factor difference.

Figure 9:
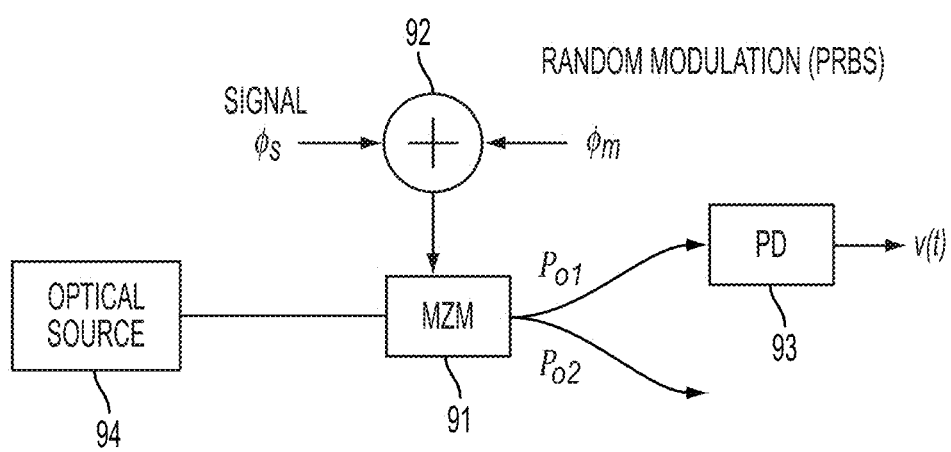
FIG. 9 illustrates another example of a photonic link portion of a photonic compressive sampling system having a single Mach Zehnder modulator biased at null.

FIG. 9 illustrates another example of a photonic link 90 for a photonic compressive sampling system, having a single Mach Zehnder modulator biased at null.

In this example, a single Mach Zehnder modulator is used, and the signal and the PRBS modulation are combined using an RF combiner 92. The RF combiner combines the signal and the PRBS modulation and applies the combined signal to the Mach Zehnder modulator 91. The combined signal amplitude modulates the optical energy $P_i$ from the laser optical source 94. In this example, the optical power that is output from the Mach Zehnder modulator and that is input to the photodiode is $P_{O1}$, which is equal to $$P_{O1}=(P_i/2)(1 \pm \cos(\phi_s + \phi_m + \phi_b)),$$

with $\phi_b$ being the bias phase of the Mach Zehnder modulator.

In order for the random modulation to properly multiply the signal, the Mach Zehnder modulator must be biased at null ($\phi_b=0$). With the MZM biased at null, the optical power output of the MZM is $$P_{O1}=(P_i/2)(1+\cos\phi_s \cos\phi_m - \sin\phi_s \phi_m). \quad (20)$$

If the modulation voltage toggles between $-V_\pi/2$ and $+V_\pi/2$, for example, with an ac-coupled modulation driver, the MZM optical output power will be $$P_{O1} = \begin{cases} 1 + \sin\phi_s & \phi_m = -\pi/2 \\ 1 - \sin\phi_s & \phi_m = \pi/2 \end{cases} \approx (Pi/2) \begin{cases} 1 + \phi_s \\ 1 - \phi_s \end{cases} \quad (21)$$

The photonic link 90 of FIG. 9 is both favorable and practical. The output RF signal toggles between two states with a πRF-phase difference, and the signal is always present at the output. In addition, the modulation driver can be ac-coupled with the modulation voltage at the MZM having a zero mean with the peak-to-peak voltage equal to the half wave voltage.

Figure 10:
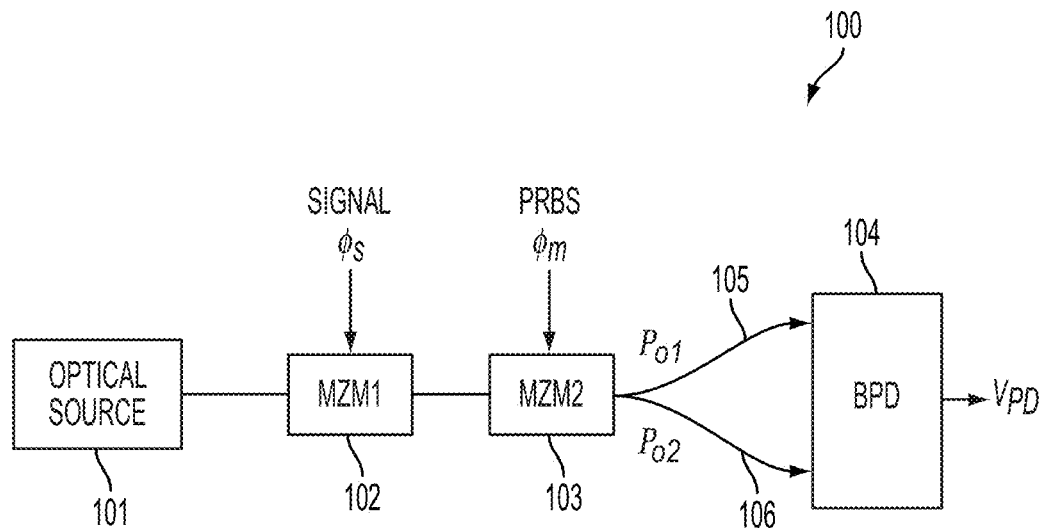
FIG. 10 illustrates another example of a photonic link portion of a photonic compressive sampling system, having two Mach Zehnder modulators in series, with balanced photodetection.

FIG. 10 illustrates another example of a photonic link system for a compressive sampling system, having two Mach Zehnder modulators in series, with balanced photo-detection.

Two Mach Zehnder modulators 102 and 103 are configured in series, with the signal voltage being input to the first MZM 102 and the PRBS modulation voltage being input to the second MZM 103. Both outputs 105, 106 of the second dual-output Mach Zehnder modulator, $P_{O1}$ and $P_{O2}$, are used, with both outputs being simultaneously input to the balanced photodiode 104. Since the RF signal modulated onto the two MZM outputs are approximately π out of phase, the balanced photodiode 104 can yield approximately a 6 dB improvement in output signal-to-noise ratio. Note that this photonic link 100 has the same front end as the system used in the experimental demonstration (as shown in FIG. 4), but with a balanced photodiode at the output of the second MZM.

Note that FIG. 10 shows that the signal voltage v(t) modulates the optical energy from the optical source at MZM1, after which the random modulation $V_{PRBS}(t)$ modulates the optical output of MZM1. It is also suitable to modulate the optical energy from the optical source with the random modulation voltage $V_{PRBS}(t)$ first, and then modulate the resulting optical energy with the signal voltage v(t).

Figure 11:
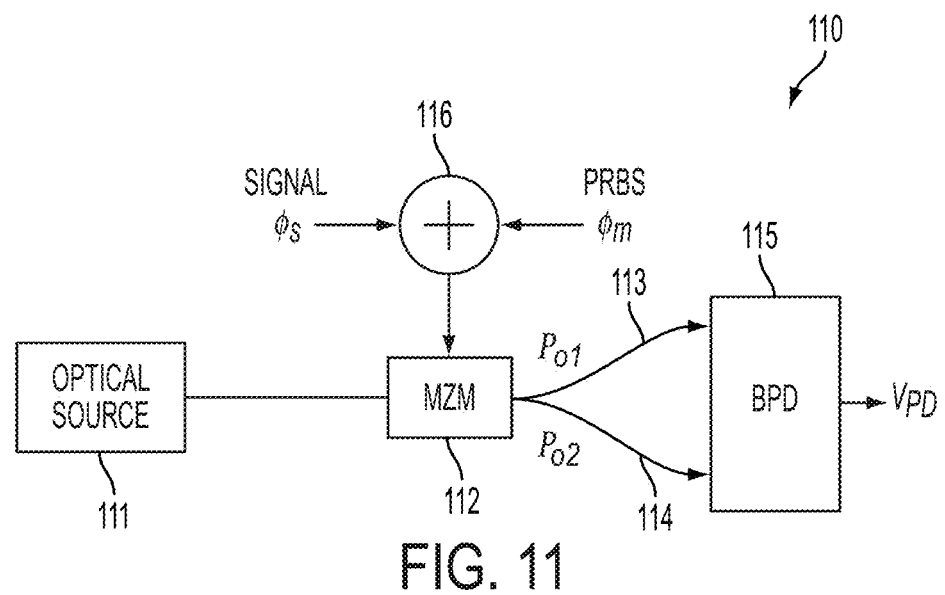
FIG. 11 illustrates another example of a photonic link portion of a photonic compressive sampling system, having one Mach Zehnder modulators, with balanced photodetection.

FIG. 11 illustrates another example of a photonic link system 110 for a compressive sampling system, having one dual-output Mach Zehnder modulator, and balanced photo-detection.

As in the example shown in FIG. 10, the signal voltage and the PRBS modulation voltage are combined using an RF combiner 116, and the combined signal is applied to the Mach Zehnder modulator 112. The combined signal amplitude modulates the optical energy from the laser optical source 111. The Mach Zehnder modulator 112 is biased at null, and the modulation voltage toggles between $-V_\pi/2$ and $+V_\pi/2$. The balanced photodiode 115 simultaneously receives the light from both outputs 113, 114 of the Mach Zehnder modulator. This architecture can provide approximately a 6 dB higher RF output SNR compared to the system of FIG. 10.

Figure 12:
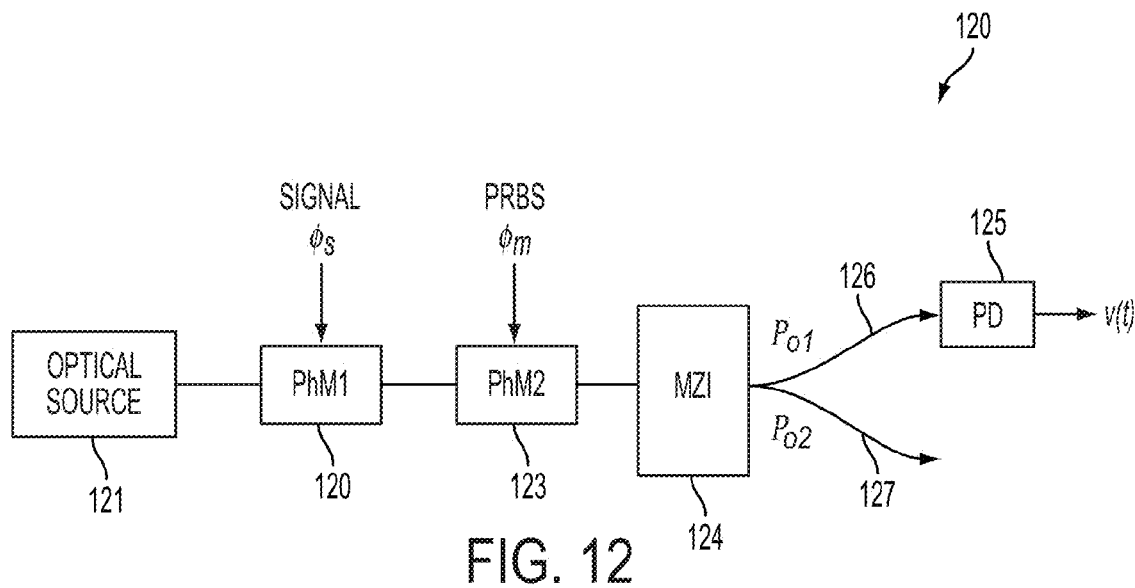
FIG. 12 illustrates another example of a photonic link portion of a photonic compressive sampling system, having two electro-optic phase modulators, and a path-imbalanced Mach-Zehnder interferometer biased at null.
Figure 13:
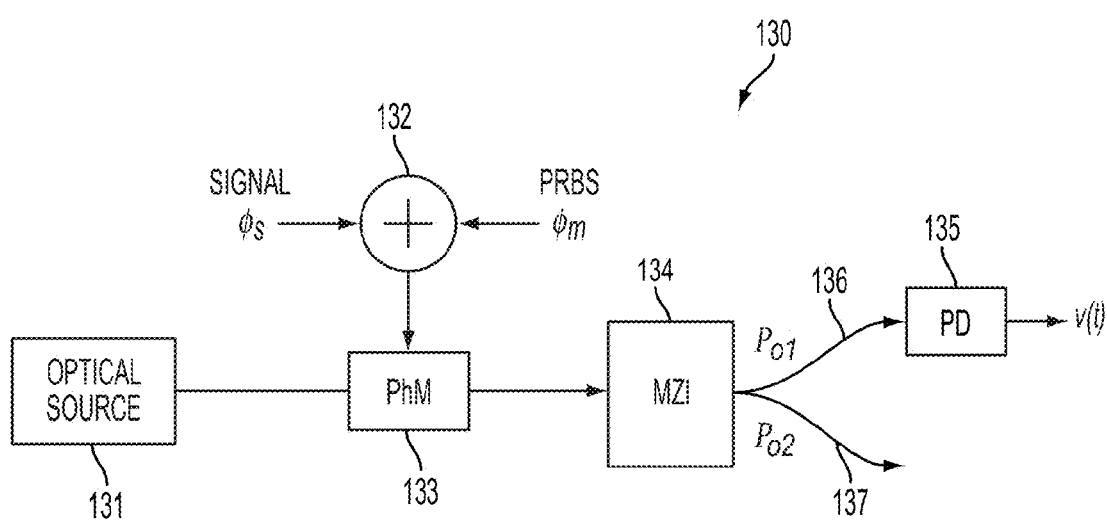
FIG. 13 illustrates another example of a photonic link portion of a photonic compressive sampling system having a single electro-optic phase modulator and path imbalanced MZI, and in which the signal and random modulation are summed with a radio frequency (RF) combiner prior to application to the phase modulator.

FIG. 12 illustrates another example of a photonic link 120 for a photonic compressive sampling system, the link having two electro-optic phase modulators 122, 123 in series and a path-imbalanced dual-output Mach-Zehnder interferometer (MZI) 124 biased at null. One of the electro-optic phase modulators 122 receives the signal voltage and phase modulates the optical energy from the laser optical source 121, and the other phase modulators 123 receives the PRBS modulation voltage 123, and modulates the optical power it receives from the first phase modulator 122. The optical power output from the second electro-optic phase modulator 123 is input to a path-imbalanced Mach Zehnder interferometer 124 biased at null ($\phi_b=0$). The path-imbalanced MZI biased at null is needed to demodulate the phase-modulated optical signal to provide proper multiplication between the signal and random modulation. The MZI naturally provides two optical outputs that differ in RF phase by approximately $\pi$. The system can be operated with only one of the outputs 126 connected to a photodetector 125, which is known as single-ended operation (FIG. 13). Alternately, the system can be operated with both MZI outputs 122, 127 ($P_{O1}$ and $P_{O2}$) connected to a photodiode pair configured for balanced detection (not shown), in a manner similar to that shown in FIG. 12 (in which both outputs are transmitted to the balanced photodetector).

In this example, the optical power output of the MZI is $$P_{O1,2}=(P_i/2)(1\pm\cos(\phi_b-\Delta\phi_s-\Delta\phi_m))$$

where $\Delta\phi_s=\phi_s(t-\tau)-\phi_s(t)$ and $\Delta\phi_m=\phi_m(t-\tau)-\phi_m(t)$.
With the MZI biased at null, the output optical power of the MZI can be written as $$P_{O1,2}=(P_i/2)(1\pm\cos\Delta\phi_s\cos\Delta\phi_m-\sin\Delta\phi_s\sin\phi_m).$$

Thus, when the modulation toggles between $-\pi/2$ and $\pi/2$, the optical power at either one of the MZI outputs is $$P_{O1,2}=(P_i/1)\begin{cases}1\pm\sin\Delta\phi_s & \Delta\phi_m=-\pi/2\\1\mp\sin\Delta\phi_s & \Delta\phi_m=+\pi/2.\end{cases}$$

The output can be linearized in $\Delta\phi_s$, the RF phase of the output states toggle by $\pi$ as required for random modulation, and the applied modulation voltage is zero-mean symmetric.

Note that the frequency response of the MZI in the FIG. 12 link can place significant restrictions on the usable frequency range of the photonic link, compared to the configurations that employ MZMs.

Note that FIG. 12 shows that the signal voltage v(t) modulates the optical energy from the optical source at PhM1, after which the random modulation $V_{PRBS}(t)$ modulates the optical output of PhM1. It is also suitable to modulate the optical energy from the optical source with the random modulation voltage $V_{PRBS}(t)$ first, and then modulate the resulting optical energy with the signal voltage v(t).

FIG. 13 illustrates another example of a photonic link for a photonic compressive sampling system, having a single electro-optic phase modulator and a path imbalanced dual output MZI, and in which the signal and random modulation are summed with an RF combiner prior to application to the phase modulator.

Using a path-imbalanced Mach-Zehnder interferometer biased at null provides proper multiplication between the signal and random modulation. The MZI naturally provides two optical outputs that differ in RF phase by approximately $\pi$. In this example, the system is operated with only one of the outputs connected to a photodetector.

The output power at the MZI outputs can be written as $$P_{O1,2}=(P_i/2)(1\pm\cos(\phi_b-\Delta\phi_s-\Delta\phi_m)), \text{ in which}$$

$\Delta\phi_s=\phi_s(t-\tau)-\phi_s(t)$ and $\Delta\phi_m=\phi_m(t-\tau)-\phi_m(t)$.

When the MZI is biased at null ($\phi_b=0$), the output power of the MZI can be written as $$P_{O1,2}=(P_i/2)(1\pm\cos\Delta\phi_s\cos\Delta\phi_m-\sin\Delta\phi_s\sin\phi_m).$$

Figure 14:
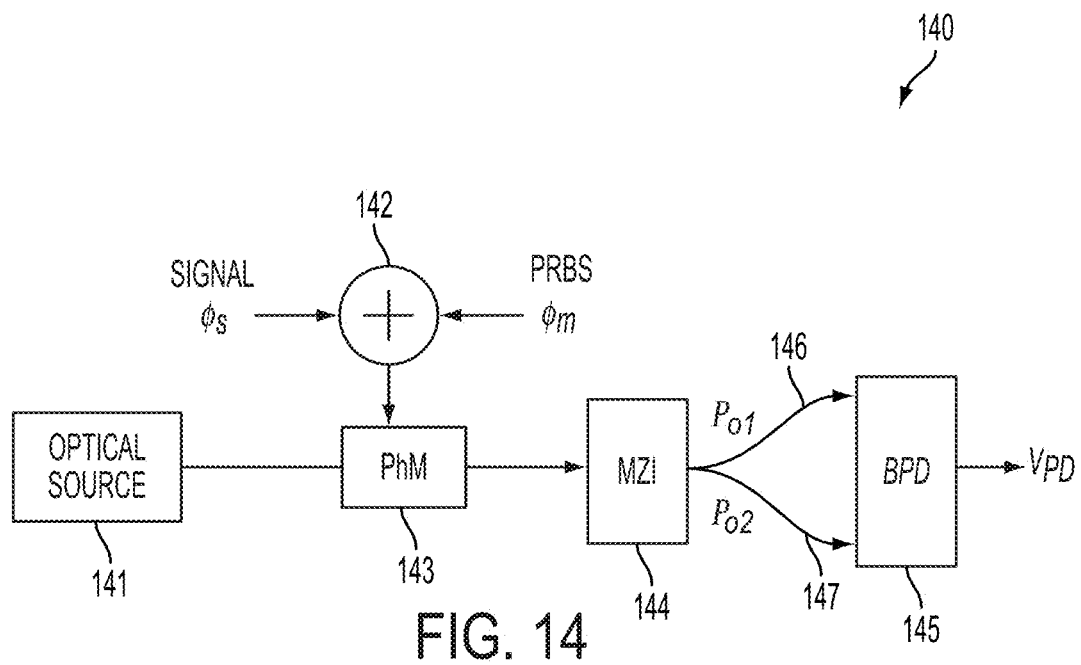
FIG. 14 illustrates another example of a photonic link portion of a photonic compressive sampling system having a single electro-optic phase modulator and path imbalanced MZI, and in which the signal and random modulation are summed with an RF combiner prior to application to the phase modulator, and a balanced photodetector.

FIG. 14 illustrates another example of a photonic link for a photonic compressive sampling system. The system has a single electro-optic phase modulator, which receives from an RF combiner the summed signal and random modulation. The optical output of the phase modulator is input to a path imbalanced MZI. A balanced photodetector receives both outputs of the optical outputs of the MZI.

The system and methods described herein can help meet the need for signal acquisition and signal processing within the military and commercial communities, by providing a means for acquiring large bandwidth signals using commercially available digitizers operating at modest digitization rates.

The photonic compressive sampling systems described herein have several advantages over compressive sampling systems that rely on electrical mixers. For example, the optical modulators provide a much higher operational speed and large instantaneous bandwidth. The photonic approach described herein provides a clear technological path to achieving reconstruction of signals in excess of 50 GHz or higher using electrical digitizers operating at sampling rates well below 50 GHz. This approach also allows performing certain signal processing functions in the optical domain as part of the overall compressive sampling system. Such RF processing functions include, but are not limited to, channelization, filtering, true-time delay, and dispersion.

The terms RF and "radio frequency" are used herein to refer to the frequency of the electronic signal that can be modulated onto the optical carrier by the electro-optic modulator, which will have a lower frequency than the optical carrier. The terms "radio frequency" or RF are intended to refer to a frequency band of the signal—typically having a center frequency between three kilohertz and about 300 GHz.

The photonic compressive sampling systems described herein can also be used in imaging systems. In such imaging systems, the sub-Nyquist sampling will be spatial sampling over a detector array, rather than to the temporal sampling described in the examples above.

The invention has been described with reference to certain preferred embodiments. It will be understood, however, that the invention is not limited to the preferred embodiments discussed above, and that modification and variations are possible within the scope of the appended claims.

What is claimed as new and desired to be protected by Letters Patent of the United States is:

1. A photonic compressive sampling system comprising:
   a photonic link unit arranged to receive an electrical analog signal having a sparse representation, the photonic link unit having at least one electro-optic modulator configured to modulate a continuous wave optical energy with both the electrical analog signal and with a pseudorandom bit sequence signal, and having a photodetector arranged to receive the modulated optical energy from the electro-optic modulator; and
   an electrical digitizer arranged to receive an output from the photodetector, sample the photodetector output, and digitize the samples, the electrical digitizer having a fixed temporal sampling rate less than a Nyquist rate of the electrical analog signal, the digitized samples being incoherent with the sparse representation of the electrical analog signal; and a compressed sensing processor configured to receive the digitized samples and to reconstruct the sparse electrical analog signal.

2. The photonic compressive sampling system of claim 1, further comprising: a pseudorandom bit sequence generator configured to transmit the pseudorandom bit sequence signal to the electro-optic modulator and to transmit a pseudorandom bit sequence signal trigger to the electrical digitizer.

3. The photonic compressive sampling system of claim 1, further comprising:
a laser in optical communication with the electro-optic modulator, configured to generate the continuous wave optical energy.

4. The photonic compressive sampling system of claim 1, further comprising: a low pass filter or an integrator configured to receive the electrical output of the photodetector.

5. The photonic compressive sampling system of claim 1, further comprising: an amplifier configured to receive the electrical output of the photodetector, and a low pass filter or integrator configured to receive the electrical output of the amplifier.

6. The photonic compressive sampling system of claim 1, wherein the at least one electro-optic modulator comprises a first Mach Zehnder modulator and a second Mach Zehnder modulator arranged in series, the first Mach Zehnder modulator arranged to amplitude modulate the optical beam with the electrical analog signal, the second Mach Zehnder modulator arranged to amplitude modulate the optical beam with the pseudorandom bit sequence signal voltage, and the first Mach Zehnder modulator and the second Mach Zehnder modulator being biased to approximately quadrature so that output power of the photodetector output is approximately linear with respect to an input voltage of the electrical analog signal for small signal phase shifts.

7. The photonic compressive sampling system of claim 6, wherein the photodetector comprises a balanced photodetector, and wherein a first output and a second output of the second Mach Zehnder modulator are simultaneously input to the balanced photodetector.

8. The photonic compressive sampling system of claim 1, further comprising:
a combiner configured to combine the electrical analog signal and a pseudorandom bit sequence signal; and
wherein the at least one electro-optic modulator comprises a single Mach Zehnder modulator biased at null, the Mach Zehnder modulator arranged to amplitude modulate the optical energy with the combined electrical analog signal and the pseudorandom bit sequence signal from the combiner.

9. The photonic compressive sampling system of claim 8, wherein the photodetector is a balanced photodetector, and wherein a first output and a second output of the Mach Zehnder modulator are simultaneously input to the balanced photodiode.

10. The photonic compressive sampling system of claim 1, wherein the at least one electro-optic modulator comprises a first phase modulator and a second phase modulator arranged in series,
wherein the first phase modulator is configured to modulate the continuous wave optical energy with the electrical analog signal, the second phase modulator configured to receive the phase modulated optical energy and to modulate the phase modulated optical energy with the pseudorandom bit sequence signal; and
wherein the photonic link further comprises a path imbalanced Mach Zehnder interferometer biased at null, the path imbalanced Mach Zehnder interferometer being arranged to receive the optical output of the second phase modulator and to transmit the optical output of the path imbalanced Mach Zehnder interferometer to the photodetector.

11. The photonic compressive sampling system of claim 1, wherein the at least one electro-optic modulator comprises a first phase modulator and a second phase modulator arranged in series, wherein the first phase modulator is configured to modulate the continuous wave optical energy with the pseudorandom bit sequence signal, the second phase modulator configured to receive the modulated optical energy and to modulate the modulated optical energy with the electrical analog signal; and wherein the photonic link further comprises a path imbalanced Mach Zehnder interferometer biased at null, the path imbalanced Mach Zehnder interferometer being arranged to receive the optical output of the second phase modulator and to transmit the optical output of the path imbalanced Mach Zehnder interferometer to the photodetector.

12. The photonic compressive sampling system of claim 1, wherein the at least one electro-optic modulator comprises a first phase modulator and a second phase modulator arranged in series, wherein the photodetector is a balanced photodetector, the first phase modulator is configured to modulate the continuous wave optical energy with the electrical analog signal, the second phase modulator is configured to receive the phase modulated optical energy and to modulate the phase modulated optical energy with the pseudorandom bit sequence signal; and wherein the photonic link further comprises a path imbalanced Mach Zehnder interferometer biased at null, the path imbalanced Mach Zehnder interferometer being arranged to receive the optical output of the second phase modulator and to transmit two optical outputs of the path imbalanced Mach Zehnder interferometer simultaneously to the balanced photodetector.

13. The photonic compressive sampling system of claim 1, wherein the at least one electro-optic modulator comprises a first phase modulator and a second phase modulator arranged in series, wherein the photodetector is a balanced photodetector, the first phase modulator is configured to modulate the continuous wave optical energy with the pseudorandom bit sequence signal, the second phase modulator is configured to receive the phase modulated optical energy from the first phase modulator and to modulate the phase modulated optical energy with the electrical analog signal; and wherein the photonic link further comprises a path imbalanced Mach Zehnder interferometer biased at null, the path imbalanced Mach Zehnder interferometer being arranged to receive the optical output of the second phase modulator and to transmit two optical outputs of the path imbalanced Mach Zehnder interferometer simultaneously to the balanced photodetector.

14. The photonic compressive sampling system of claim 1, further comprising:
a combiner configured to combine the electrical analog signal and a pseudorandom bit sequence signal;
wherein the at least one electro-optic modulator comprises a single phase modulator and a path-imbalanced Mach Zehnder interferometer arranged in series, wherein the phase modulator is configured to modulate the continuous wave optical energy with the combined electrical analog signal and pseudorandom bit sequence signal, wherein the path-imbalanced Mach Zehnder interferometer is biased at null and is configured receive the optical output of the phase modulator and to transmit the optical output of the Mach Zehnder interferometer to the photodetector.

15. The photonic compressive sampling system of claim 1, further comprising:
a combiner configured to combine the electrical analog signal and a pseudorandom bit sequence signal;
wherein the photodetector is a balanced photodetector;
wherein the at least one electro-optic modulator comprises a single phase modulator and a path-imbalanced Mach Zehnder interferometer arranged in series, wherein the phase modulator is configured to modulate the continuous wave optical energy with the combined electrical analog signal and pseudorandom bit sequence signal, wherein the path-imbalanced Mach Zehnder interferometer is biased at null and is configured receive the optical output of the phase modulator and to simultaneously transmit two optical outputs of the Mach Zehnder interferometer to the balanced photodetector.

16. A method for reconstructing an electrical analog signal having a sparse representation, the method comprising:
modulating, with at least one electro-optic modulator, continuous wave optical energy with both the electrical analog signal having a sparse representation and with a pseudorandom bit sequence signal;
receiving, with a photodetector, the modulated optical energy from the at least one electro-optic modulator; and sampling and digitizing, with an electrical digitizer, the output from the photodetector, the electrical digitizer having a fixed temporal sampling rate less than a Nyquist rate of the electrical analog signal, wherein digitized samples from the electrical digitizer are incoherent with the sparse representation of the electrical analog signal; and
transmitting the digitized samples to a compressed sensing processor, and
reconstructing the sparse electrical analog signal with a compressed sensing processor.

17. The method of claim 16, further comprising:
generating a pseudorandom bit sequence voltage; and
transmitting the pseudorandom bit sequence voltage to the electro-optic modulator and a pseudorandom bit sequence signal trigger to the electrical digitizer.

18. The method of claim 16, further comprising:
generating, with a laser, the continuous wave optical energy.

19. The method of claim 16, further comprising:
low pass filtering or integrating the electrical output of the photodetector.

20. The method of claim 16, further comprising:
amplifying the electrical output of the photodetector; and
low pass filtering or integrating the amplified output of the photodetector.

21. The method of claim 16, wherein the at least one electro-optic modulator includes a first Mach Zehnder modulator and a second Mach Zehnder modulator arranged in series, the first Mach Zehnder modulator arranged to amplitude modulate the optical beam with the electrical analog signal, the second Mach Zehnder modulator arranged to amplitude modulate the optical beam with the pseudorandom bit sequence signal voltage, and the first Mach Zehnder modulator and the second Mach Zehnder modulator being biased to approximately quadrature so that output power of the photodetector output is approximately linear with respect to an input voltage of the electrical analog signal for small signal phase shifts.

22. The method according to claim 21, wherein the photodetector is a balanced photodetector, and the method further comprises:
simultaneously inputting a first output and a second output of one of the first Mach Zehnder or the second Mach Zehnder modulator to the balanced photodetector.

23. The method according to claim 16, wherein the at least one electro-optic modulator comprises a single Mach Zehnder modulator biased at null, the method further comprising:
combining the electrical analog signal and a pseudorandom bit sequence signal in a combiner;
receiving, with the Mach Zehnder modulator, the combined electrical analog signal and pseudorandom bit sequence voltage from the combiner; and wherein said modulating includes amplitude modulating the optical energy with the combined electrical analog signal and the pseudorandom bit sequence signal.

24. The method according to claim 21, wherein the photodetector is a balanced photodetector, the method further including:
simultaneously inputting a first output and a second output of the Mach Zehnder modulator to the balanced photodiode.

25. The method of claim 16, wherein the at least one electro-optic modulator comprises a first phase modulator and a second phase modulator arranged in series, with one of the first phase modulator and the second phase modulator receiving the electrical analog signal and the other of the first phase modulator and the second phase modulator receiving the pseudorandom bit sequence signal, the method further comprising:
receiving, with a path imbalanced Mach Zehnder interferometer biased at null, the optical output of the second phase modulator;
and wherein said receiving, with a photodetector, includes receiving the optical output of the path imbalanced Mach Zehnder interferometer.

26. The method of claim 16, wherein the photodetector is a balanced photodetector,
wherein said modulating includes
modulating, with the first phase modulator, the continuous wave optical energy with the electrical analog signal, and
modulating, with the second phase modulator, the phase modulated optical energy with the pseudorandom bit sequence signal,
wherein the method further comprises:
receiving, with a path imbalanced Mach Zehnder interferometer biased at null, the optical output of the second phase modulator; and
transmitting two optical outputs of the path imbalanced Mach Zehnder interferometer simultaneously to the balanced photodetector.

27. The method of claim 16, wherein the photodetector is a balanced photodetector,
wherein said modulating includes
modulating, with the first phase modulator, the continuous wave optical energy with the pseudorandom bit sequence signal, and modulating, with the second phase modulator, the phase modulated optical energy with electrical analog signal, wherein the method further comprises:

receiving, with a path imbalanced Mach Zehnder interferometer biased at null, the optical output of the second phase modulator; and transmitting two optical outputs of the path imbalanced Mach Zehnder interferometer simultaneously to the balanced photodetector.

28. The method according to claim 16, wherein the at least one electro-optic modulator includes a single phase modulator and a path-imbalanced Mach Zehnder interferometer biased at null arranged in series, the method further comprising:

combining the electrical analog signal and a pseudorandom bit sequence signal;

modulating, with the phase modulator, the continuous wave optical energy with the combined electrical analog signal and pseudorandom bit sequence signal;

receiving, with the path-imbalanced Mach Zehnder interferometer biased at null, the optical output of the phase modulator;

and transmitting the optical output of the Mach Zehnder interferometer to the photodetector.

29. The method according to claim 16, wherein the photodetector is a balanced photodetector, the method further comprising:

combining the electrical analog signal and a pseudorandom bit sequence signal;

said modulating includes modulating, with a phase modulator, the continuous wave optical energy with the combined electrical analog signal and pseudorandom bit sequence signal, and receiving, with a path-imbalanced Mach Zehnder interferometer is biased at null, the optical output of the phase modulator;

the method further comprising:

simultaneously transmitting two optical outputs of the Mach Zehnder interferometer to the balanced photodetector.

* * * * *